United States Patent
Alberkrack et al.

(10) Patent No.: US 7,468,873 B2
(45) Date of Patent: Dec. 23, 2008

(54) OVER-VOLTAGE PROTECTED SEMICONDUCTOR DEVICE

(75) Inventors: Jade H. Alberkrack, Tempe, AZ (US); David Cave, Tempe, AZ (US)

(73) Assignee: Dolpan Audio, LLC, Dover, DE (US)

( * ) Notice: Subject to any disclaimer, the term of this patent is extended or adjusted under 35 U.S.C. 154(b) by 80 days.

(21) Appl. No.: 11/484,869

(22) Filed: Jul. 11, 2006

(65) Prior Publication Data
US 2008/0013229 A1    Jan. 17, 2008

(51) Int. Cl.
*H02H 3/26* (2006.01)
*H02H 3/18* (2006.01)

(52) U.S. Cl. ........................................ 361/86
(58) Field of Classification Search ............ 361/86
See application file for complete search history.

(56) References Cited
U.S. PATENT DOCUMENTS 4,893,158 A * 1/1990 Mihara et al. ............... 257/341
6,924,532 B2 * 8/2005 Pfirsch et al. ............... 257/341
2008/0050876 A1 * 2/2008 Matocha et al. ............. 438/269

* cited by examiner

*Primary Examiner*—Ronald W Leja
(74) *Attorney, Agent, or Firm*—Knobbe Martens Olson & Bear LLP

(57) ABSTRACT

In accordance with the principles of the invention, a semiconductor device is provided that has a power transistor and a voltage sensing transistor formed on a substrate. The power transistor has first and second terminals and a control terminal and having a characteristic first breakdown voltage across the first and second terminals. The voltage sensing transistor is coupled across the power transistor first and second terminals. The voltage sensing transistor has a second element characteristic breakdown voltage that is less than the power transistor breakdown voltage. The second transistor provides a control signal to the power transistor control terminal when the voltage across the power transistor first and second terminals exceeds the second element characteristic breakdown voltage.

23 Claims, 2 Drawing Sheets

US 7,468,873 B2

OVER-VOLTAGE PROTECTED SEMICONDUCTOR DEVICE

CROSS-REFERENCE TO RELATED APPLICATIONS

This application is related to co-pending application Ser. No. 11/484,879 filed on even date herewith and assigned to a common assignee. The entirety of the disclosure contained in that co-pending application is incorporated herein, by reference.

FIELD OF THE INVENTION

The invention pertains to semiconductor devices, in general, and to providing over-voltage protection to semiconductor devices, in particular

BACKGROUND OF THE INVENTION

Inductive loads switched by a power transistor can produce voltages high enough so that without over-voltage protection, the power transistor may be permanently damaged.

In the past, one way of providing protection for power MOSFETs has been utilizing a feedback path comprising a series connected zener diode and a conventional diode connected across the gate-drain of the MOSFET as shown in FIG. 1.

To protect against over-voltage, the zener voltage Vz plus the diode drop voltage Vd plus the MOSFET gate to source voltage Vgs must be less than the MOSFET breakdown voltage. As a practical matter, the total voltage drop of Vz+Vd+Vgs must be much less than the MOSFET breakdown voltage due to the fact that these elements do not track fabrication process variations in the devices.

It is desirable to provide a power transistor device that has over-voltage protection integral to the device.

SUMMARY OF THE INVENTION

In accordance with the principles of the invention, a semiconductor device is provided that has a power transistor and a voltage sensing transistor formed on a substrate. The power transistor has first and second terminals and a control terminal and having a characteristic first breakdown voltage across the first and second terminals. The voltage sensing transistor is coupled across the power transistor first and second terminals. The voltage sensing transistor has a characteristic second element breakdown voltage that is less than the power transistor breakdown voltage. When the voltage across the power transistor first and second terminals reaches the characteristic second element breakdown voltage, the voltage sensing transistor turns on and, in turn causes the power transistor to turn on protecting the power transistor and the voltage sensing transistor from any increase in voltage.

In accordance with an aspect of the invention the power transistor and the voltage sensing transistor are concurrently fabricated on the substrate. The power transistor is laid out on said substrate to have the characteristic first breakdown voltage, and the voltage sensing transistor is laid out on the substrate to have the characteristic second element breakdown voltage.

Still further in accordance with the principles of the invention a current limiting element formed on said substrate and coupled to the voltage sensing transistor to limit current flow through the voltage sensing transistor when the voltage across the power transistor exceeds the characteristic second element breakdown voltage.

Yet further in accordance with another aspect of the invention, a feedback circuit is formed on the substrate and coupled between the voltage sensing transistor and the power transistor control terminal.

In the illustrative embodiment of the invention the power transistor comprises at least one MOSFET power transistor first cell having a source, a drain and a gate. The MOSFET power transistor first cell has a first drain to source characteristic breakdown voltage. The voltage sensing transistor comprises a MOSFET transistor second cell having a source, a drain connected in common with the MOSFET power transistor first cell drain, and a gate connected in common with the MOSFET power transistor first cell gate. The MOSFET transistor second cell is designed to have a drain-source characteristic breakdown voltage, also referred to herein as a characteristic second element breakdown voltage, that is less than the first characteristic breakdown voltage.

In the illustrative embodiment of the invention, the power transistor comprises at least a second MOSFET power transistor first cell that is substantially identical to the at least one MOSFET power transistor first cell.

BRIEF DESCRIPTION OF THE DRAWING

The invention will be better understood from a reading of the following detailed description of the drawing figures in which like reference designations are utilized to identify like elements, and in which.

DETAILED DESCRIPTION

To obtain higher current switching capability, power transistors may be comprised of a plurality of individual power transistor cells fabricated on a substrate and connected in parallel.

Figure 2:
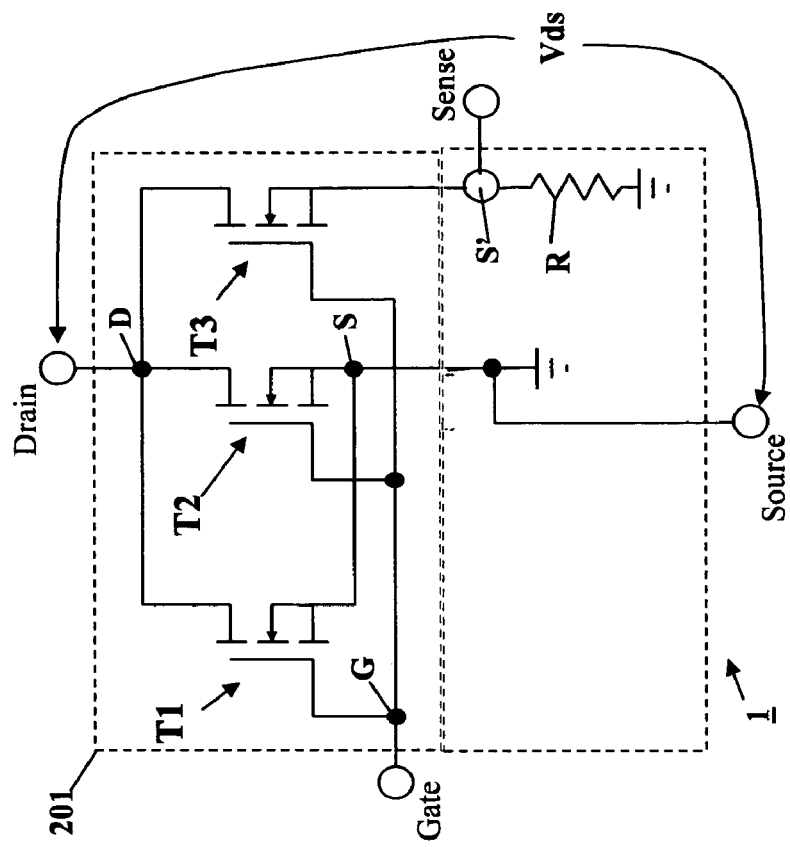
FIG. 2 illustrates a MOSFET arrangement in accordance with the principles of the invention.
Figure 1:
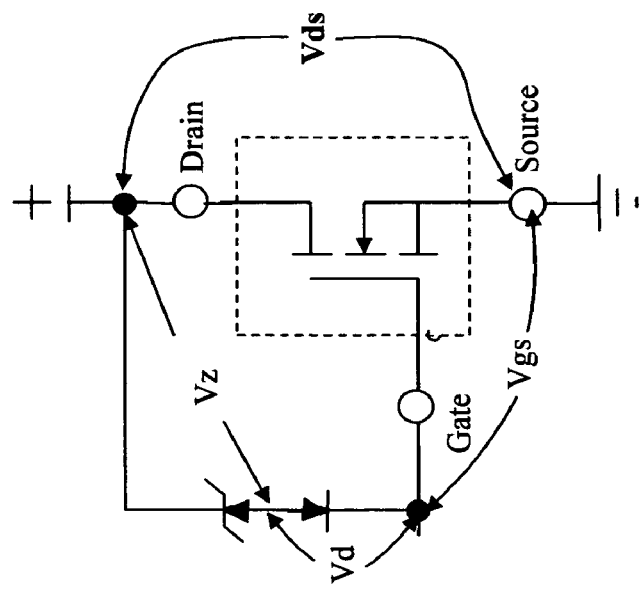
FIG. 1 illustrates a prior art arrangement for protection of a power MOSFET device.

Turning now to one illustrative embodiment of the invention shown in FIG. 2, MOSFET power transistor structure 1 is fabricated on a single substrate 201. The power transistor structure 1 includes two MOSFET power transistor cells T1, T2 fabricated on the single substrate 201. Transistor cells T1, T2 have their respective gates, drains and sources connected in common to gate node G, drain node D, and source node S, respectively. Each of transistor cells T1, T2 has a first characteristic drain-source voltage Vds which is a characteristic breakdown voltage that is dependent on several factors, including but not limited to the layout of the transistors on the substrate 201. The layout of both transistor cells T1, T2 is identical and the characteristic drain-source breakdown voltages of both cells are the same.

Although two transistor cells are shown, it will be appreciated by those skilled in the art that the power transistor structure may have fewer or more transistor cells.

In addition to the two power transistor cells T1, T2, power transistor structure 1 includes a breakdown voltage sensing transistor cell T3 is formed on substrate 201. Transistor cell T3 is fabricated at the same time as transistor cells T1, T2 but is designed to have a drain source characteristic breakdown voltage Vds that is less than the drain-source characteristic breakdown voltage of the power transistor formed by transistor cells T1, T2. Voltage sensing transistor cell T3 has its drain and gate connected to the drain D and gate G, respectively, of transistor cells T1, T2. The source terminal of transistor cell T3 is coupled to a current limiting device or resistor. In the illustrative embodiment of the invention, resistor R is formed on the same substrate 201, but may in some embodiments be separate from substrate 201.

In operation, when the drain-source voltage Vds across transistor cells T1, T2 reaches the second element characteristic breakdown voltage of sensing transistor cell T3, transistor cell T3 conducts current. The current through transistor T3 is limited by resistor R which prevents damage to transistor cell T3. A voltage is produced across resistor R at sense terminal S'. The voltage at sense terminal S' may be utilized to control the gate of the power transistor formed by transistor cells T1, T2 such that the combined power transistor device formed on substrate 201 makes power transistor 1 self-protecting against breakdown voltages applied across its switching path.

The drain-source breakdown voltage of sense transistor cell T3 tracks the drain-source power transistor cells T1, T2 over process variations since it is an integral part of the power transistor structure 1.

In the illustrative embodiment shown in FIG. 2, transistor cells T1, T2, T3 are N-channel MOSFET structures. As will be appreciated by those skilled in the art, the principles of the invention may also be utilized with other transistor structures including P-channel MOSFET, N- and P-channel IGBTs, as well as NPN and PNP transistors.

Figure 3:
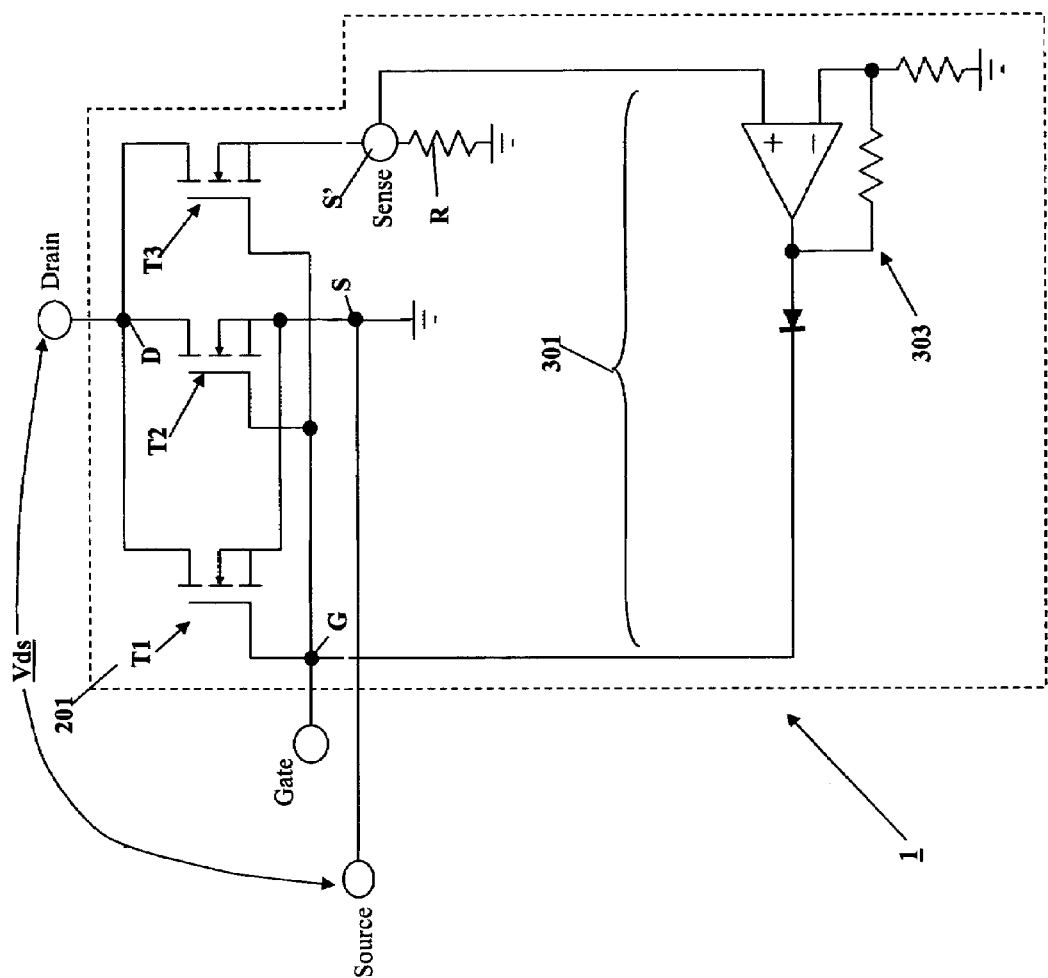
FIG. 3 illustrates a second MOSFET arrangement in accordance with the principles of the invention.

Turning now to FIG. 3, a feedback circuit or path 301 is provided from the sense transistor cell T3 to the control or gate input G of the power transistor structure 1. Feedback circuit or path 301 includes an amplifier circuit 303. As the voltage across sensing element or transistor cell T3 reaches the second element characteristic breakdown voltage, sensing element or transistor cell T3 produces a voltage at sense terminal or node S', amplifier 303 provides an output level at control input or gate G of the power transistor structure 1 to turn on the power transistor cells T1, T2 and sense cell T3 thus providing protection by limiting the applied drain voltage to less than the breakdown voltage of cells T1, T2.

The specific structure of amplifier 303 may be any one of a number of known feedback amplifiers. In addition a gate circuit may also be included to assure that the power transistor structure 1 does not turn on as power is applied.

In the illustrative embodiments of the over-voltage protected structures, the breakdown voltage sensing cell or element T3 is shown with a common drain to the power MOSFET cells or elements T1, T2, and the sense output is derived from the source of the over-voltage sensing element T3. In other embodiments, the voltage sensing element source is in common with the sources of the power MOSFET elements, and the sense output is derived from the drain of the breakdown voltage sensing element The invention has been described in terms of specific embodiments. It will be appreciated by those skilled in the art that various changes and modifications may be made to the embodiments without departing from the spirit or scope of the invention. It is intended that the scope of the invention not be limited to the specific embodiments shown and described, but that the scope of the invention be limited only by the claims appended hereto.

What is claimed is:

1. A semiconductor device comprising:
   a substrate;
   a first circuit cell formed on said substrate, said first circuit cell comprising first and second terminals and a control terminal and having a characteristic first breakdown voltage across said first and said second terminals;
   a voltage sensing transistor formed on said substrate, said voltage sensing transistor being coupled across said first and second terminals, said voltage sensing transistor having a second element characteristic breakdown voltage, said second element characteristic breakdown voltage being less than said characteristic first breakdown voltage, said voltage sensing transistor providing a control signal to said first circuit cell control terminal when the voltage across said first circuit cell first and second terminals exceeds said second element characteristic breakdown voltage.

2. A semiconductor device in accordance with claim 1, comprising:
   a current limiting element formed on said substrate and coupled to said voltage sensing transistor to limit current flow through said voltage sensing transistor when said voltage across said first circuit cell exceeds said second element characteristic breakdown voltage.

3. A semiconductor device in accordance with claim 2, wherein:
   said first circuit cell is a cell of a power transistor.

4. A semiconductor device in accordance with claim 2, comprising:
   a feedback circuit formed on said substrate and coupled between said voltage sensing transistor and said first circuit cell control terminal.

5. A semiconductor device in accordance with claim 4, wherein:
   said first circuit cell is a cell of a power transistor.

6. A semiconductor device in accordance with claim 4, wherein:
   said feedback circuit comprises an amplifier having an input coupled to said voltage sensing transistor and an output coupled to said control terminal.

7. A semiconductor device in accordance with claim 1, comprising:
   said first circuit cell and said voltage sensing transistor being concurrently fabricated on said substrate.

8. A semiconductor device in accordance with claim 7, wherein:
   said first circuit cell is a cell of a power transistor.

9. A semiconductor device in accordance with claim 7, wherein:
   said first circuit cell is laid out on said substrate to have said characteristic first breakdown voltage, and said voltage sensing transistor is laid out on said substrate to have said second element characteristic breakdown voltage.

10. A semiconductor device in accordance with claim 1, wherein:
    said first circuit cell is a cell of a power transistor.

11. A power semiconductor device, comprising:
    a semiconductor substrate:
    said semiconductor substrate comprising at least one MOSFET power transistor first cell, said at least one MOSFET power transistor first cell comprising a source, a drain and a gate, said at least one MOSFET power transistor first cell having a first drain to source characteristic breakdown voltage;
    said semiconductor substrate further comprising a MOSFET transistor second cell, said MOSFET transistor second cell having a source, a drain connected in common with said at least one MOSFET power transistor first cell drain, and a gate connected in common with said at least one MOSFET power transistor first cell gate, and said MOSFET transistor second cell being designed to have a second drain-source characteristic breakdown voltage, said second characteristic breakdown voltage being less than said first characteristic breakdown voltage.

12. A power semiconductor device in accordance with claim 11, comprising:
at least a second MOSFET power transistor first cell, said second MOSFET power transistor first cell being substantially identical to said at least one MOSFET power transistor first cell, said at least a second MOSFET tower transistor first cell having a drain connected in common with said at least one MOSFET power transistor first cell drain and said MOSFET transistor second cell drain, said at least a second MOSFET power transistor first cell having a gate connected in common with said at least one MOSFET power transistor first cell gate and said MOSFET transistor second cell gate; said at least a second MOSFET power transistor first cell having a source connected in common with said at least one MOSFET power transistor first cell source.

13. A power semiconductor device in accordance with claim 12, comprising;
a resistance serially connected with said second transistor cell source.

14. A power semiconductor device in accordance with claim 13, comprising:
a circuit coupled to said second transistor cell source to provide a control signal when the voltage across said MOSFET transistor first cell exceeds said second characteristic breakdown voltage, said circuit further coupled to said at least one MOSFET power transistor first cell gate and said at least a second MOSFET power transistor first cell gate to provide said control signal thereto.

15. A power semiconductor device in accordance with claim 11, comprising:
a resistance serially connected with said second transistor cell source.

16. A power semiconductor device in accordance with claim 15, comprising:
a circuit coupled to said second transistor cell source to provide a control signal when said the voltage across said MOSFET transistor first cell exceeds said second characteristic breakdown voltage, said circuit further coupled to said at least one MOSFET power transistor first cell gate operates to provide said control signal thereto.

17. A power semiconductor device, comprising:
a semiconductor substrate:
said semiconductor substrate comprising at least one power transistor first cell, said at least one power transistor first cell comprising a first terminal, a second terminal and a control terminal, said at least one power transistor having a first characteristic breakdown voltage between said first and said second terminals;
said semiconductor substrate further comprising a transistor second cell, said transistor second cell having a first terminal connected in common with said at least one power transistor first cell first terminal, and a control terminal connected in common with said at least one power transistor first cell control terminal and said transistor second cell being designed to have a second element characteristic breakdown voltage, said second element characteristic breakdown voltage being less than said first breakdown voltage.

18. A power semiconductor device in accordance with claim 17, comprising:
a circuit coupled to said second transistor cell second terminal to provide a control signal when said transistor second cell is subjected to said second breakdown voltage, said circuit further coupled to said at least one power transistor first cell control terminal to provide said control signal thereto.

19. A power semiconductor device, comprising:
a semiconductor substrate:
said semiconductor substrate comprising at least one MOSFET power transistor first cell, said at least one MOSFET power transistor first cell comprising a source, a drain and a gate, said at least one MOSFET power transistor first cell having a first characteristic breakdown voltage between said drain and said source;
said semiconductor substrate further comprising a MOSFET transistor second cell, said MOSFET transistor second cell having a source, a drain, and a gate; one of said second cell source or drain connected in common with said at least one MOSFET power transistor first cell source or drain, and a gate connected in common with said at least one MOSFET power transistor first cell gate, and said MOSFET transistor second cell being designed to have a second drain-source characteristic breakdown voltage, said second characteristic breakdown voltage being less than said first characteristic breakdown voltage.

20. A power semiconductor device in accordance with claim 19, comprising:
at least a second MOSFET power transistor first cell, said second MOSFET power transistor first cell being substantially identical to said at least one MOSFET power transistor first cell, said at least a second MOSFET power transistor first cell having a drain connected in common with said at least one MOSFET power transistor first cell drain, said at least a second MOSFET power transistor first cell having a gate connected in common with said at least one MOSFET power transistor first cell gate and said MOSFET transistor second cell gate; said at least a second MOSFET power transistor first cell having a source connected in common with said at least one MOSFET power transistor first cell source.

21. A power semiconductor device in accordance with claim 20, comprising:
a resistance serially connected with the other of said source or drain of said second transistor cell.

22. A power semiconductor device in accordance with claim 21, comprising:
a circuit coupled to said other or said source or drain of said second transistor cell source to provide a control signal when the voltage across said MOSFET transistor first cell exceeds said second characteristic breakdown voltage, said circuit further coupled to said at least one MOSFET power transistor first cell gate and said at least a second MOSFET power transistor first cell gate to provide said control signal thereto.

23. A power semiconductor device in accordance with claim 19, comprising:
a resistance serially connected with the other of said source or drain of said second transistor cell.

* * * * *